United States Patent
Yugawa

(10) Patent No.: US 12,495,486 B2
(45) Date of Patent: Dec. 9, 2025

(54) WIRING BOARD

(71) Applicant: KYOCERA Corporation, Kyoto (JP)

(72) Inventor: Hidetoshi Yugawa, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 213 days.

(21) Appl. No.: 18/038,233

(22) PCT Filed: Nov. 24, 2021

(86) PCT No.: PCT/JP2021/042938
§ 371 (c)(1),
(2) Date: May 23, 2023

(87) PCT Pub. No.: WO2022/113985
PCT Pub. Date: Jun. 2, 2022

(65) Prior Publication Data
US 2023/0422393 A1 Dec. 28, 2023

(30) Foreign Application Priority Data
Nov. 27, 2020 (JP) .................. 2020-197304

(51) Int. Cl.
H05K 1/02 (2006.01)
H05K 3/10 (2006.01)
(Continued)

(52) U.S. Cl.
CPC ........... *H05K 1/0242* (2013.01); *H05K 3/108* (2013.01); *H05K 3/244* (2013.01); *H05K 3/389* (2013.01);
(Continued)

(58) Field of Classification Search
None
See application file for complete search history.

(56) References Cited

U.S. PATENT DOCUMENTS 3,881,884 A * 5/1975 Cook ................. H05K 3/388
257/781
5,458,763 A * 10/1995 Kobayashi ............ H05K 3/108
205/104

(Continued)

FOREIGN PATENT DOCUMENTS

| JP | 06-152101 A | | 5/1994 |
|---|---|---|---|
| JP | 2015156481 A | * | 8/2015 |
| JP | 2017130555 A | | 7/2017 |

*Primary Examiner* — Krystal Robinson
(74) *Attorney, Agent, or Firm* — Volpe Koenig

(57) ABSTRACT

A wiring board includes an insulation resin layer, and a wiring conductor positioned on the insulation resin layer. The wiring conductor includes a first and second underlying metal layers, a wiring metal layer positioned on the second underlying metal layer, a tin layer positioned covering the first underlying metal layer, the second underlying metal layer, and the wiring metal layer, and a silane coupling agent layer positioned covering the tin layer. When the wiring conductor is seen in a cross section in a width direction, the wiring metal layer includes, from the first underlying metal layer side, a portion with a width narrower than a width of the first underlying metal layer, a portion with a width equal to the width of the first underlying metal layer, and a portion with a width wider than the width of the first underlying metal layer.

6 Claims, 2 Drawing Sheets

(51) Int. Cl.
*H05K 3/24* (2006.01)
*H05K 3/38* (2006.01)
*H05K 1/09* (2006.01)

(52) U.S. Cl.
CPC ....... *H05K 1/09* (2013.01); *H05K 2201/0338* (2013.01); *H05K 2201/0367* (2013.01); *H05K 2203/072* (2013.01); *H05K 2203/0723* (2013.01); *H05K 2203/073* (2013.01)

(56) References Cited

U.S. PATENT DOCUMENTS

| | | | |
|---|---|---|---|
| 6,225,569 B1* | 5/2001 | Hashimoto | H05K 3/246 |
| | | | 257/781 |
| 9,566,790 B2* | 2/2017 | Yokoyama | B41J 2/1433 |
| 9,609,747 B2* | 3/2017 | Matsushita | H05K 1/092 |
| 2012/0205142 A1* | 8/2012 | Higo | H01L 23/49822 |
| | | | 174/251 |
| 2015/0195908 A1* | 7/2015 | Matsushita | H05K 1/092 |
| | | | 174/257 |

* cited by examiner

WIRING BOARD

TECHNICAL FIELD

The present invention relates to a wiring board.

BACKGROUND OF INVENTION

In recent years, in wiring patterns formed on wiring boards, fine wiring lines are formed at a high density along with downsizing or the like of electronic devices. For example, when fine wiring lines are formed at a high density as in a wiring board described in Patent Document 1, a contact area between a wiring pattern and an insulation layer is narrowed in consideration of reduction in migration (short circuit). As a result, the adhesion between the wiring pattern and the insulation layer is lowered and the reliability of the wiring board is thus lowered.

CITATION LIST

Patent Literature

Patent Document 1: JP 6-152101 A

SUMMARY

Solution to Problem

A wiring board according to the present disclosure includes an insulation resin layer, and a wiring conductor positioned on the insulation resin layer. The wiring conductor includes a first underlying metal layer, a second underlying metal layer positioned on the first underlying metal layer, a wiring metal layer positioned on the second underlying metal layer, a tin layer positioned covering the first underlying metal layer, the second underlying metal layer, and the wiring metal layer, and a silane coupling agent layer positioned covering the tin layer. When the wiring conductor is seen in a cross section in a width direction, the wiring metal layer includes, from the first underlying metal layer side, a portion with a width narrower than a width of the first underlying metal layer, a portion with a width equal to the width of the first underlying metal layer, and a portion with a width wider than the width of the first underlying metal layer.

DESCRIPTION OF EMBODIMENTS

In the wiring board of the related art described in Patent Document 1, when the fine wiring lines are formed at a high density as described above, the contact area between the wiring pattern and the insulation layer is narrowed in consideration of reduction in migration (short circuit). As a result, the adhesion between the wiring pattern and the insulation layer is lowered and the reliability of the wiring board is thus lowered. Therefore, there is a demand for a wiring board that is excellent in insulation properties by reducing migration (short circuit) between fine wiring lines and has high adhesion strength between a wiring conductor and an insulation resin layer.

In the wiring board according to the present disclosure, as described above, when the wiring conductor is seen in a cross section in a width direction, a wiring metal layer includes, from a first underlying metal layer side, a portion with a width narrower than a width of the first underlying metal layer, a portion with a width equal to the width of the first underlying metal layer, and a portion with a width wider than the width of the first underlying metal layer. Therefore, according to the present disclosure, it is possible to provide a wiring board that is excellent in insulation property by reducing migration (short circuit) between fine wiring lines and has high adhesion strength between a wiring conductor and an insulation resin layer.

Figure 1:
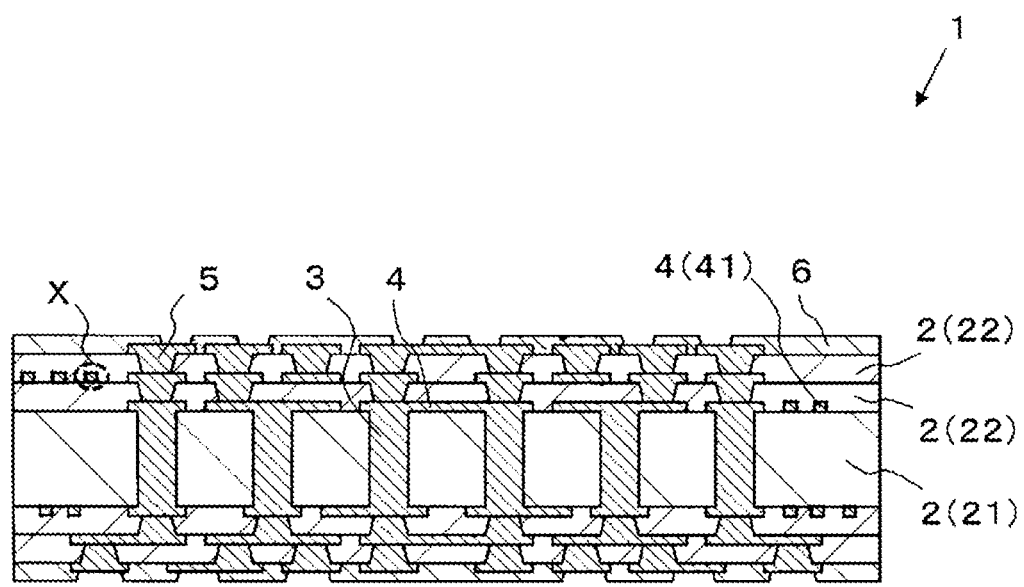
FIG. 1 is a schematic view illustrating a cross-section of a wiring board according to one embodiment of the present disclosure.

A wiring board according to one embodiment of the present disclosure will be described with reference to FIGS. 1 and 2. FIG. 1 is a schematic view illustrating a cross-section of a wiring board 1 according to one embodiment of the present disclosure. The wiring board 1 according to the embodiment includes a plurality of insulation resin layers 2 and an electrical conductor layer 4 positioned on the insulation resin layers 2.

The insulation resin layers 2 are made of a resin such as an epoxy resin, a bismaleimide-triazine resin, a polyimide resin, a polyphenylene ether resin, or a liquid crystal polymer. These resins may be used alone or in combination of two or more. Insulation particles may be dispersed in the insulation resin layers 2. The insulation particles are not limited, and examples thereof may include inorganic insulation fillers made of silica, alumina, barium sulfate, talc, clay, glass, calcium carbonate, titanium oxide, and the like, for example.

In the wiring board 1 according to the embodiment, one of the plurality of insulation resin layers 2 is a core layer 21 and the remaining insulation resin layers 2 are build-up layers 22. The core layer 21 has a thickness of, for example, from 0.04 mm to 3.0 mm.

The core layer 21 includes a through-hole conductor 3 for electrically connecting the electrical conductor layers 4 on upper and lower surfaces of the core layer 21. The through-hole conductor 3 is located in through-holes penetrating the upper and lower surfaces of the core layer 21. The through-hole conductor 3 is made of a conductor made of metal plating such as copper plating, for example. The through-hole conductor 3 is connected to the electrical conductor layers 4 on both surfaces of the core layer 21. The through-hole conductor 3 may be formed only on inner wall surfaces of the through-holes or the through-holes may be filled with the through-hole conductor 3.

The build-up layers 22 have a thickness of, for example, from 5 μm to 100 μm. The build-up layers 22 may be the same resin or different resins.

The electrical conductor layer 4 is positioned on a main surface of the insulation resin layer 2, i.e., on a main surface of the core layer 21 and a main surface of the build-up layer 22. The electrical conductor layer 4 is made of a conductor such as copper, for example, a copper foil or copper plating. A thickness of the electrical conductor layer 4 is not particularly limited, and, for example, is 2 μm or greater and 50 μm or less. When a plurality of electrical conductor layers 4 are provided, the electrical conductor layers 4 may be the same electrical conductors or different electrical conductors.

Each of the build-up layers 22 includes via-hole conductors 5 for electrically connecting the electrical conductor layers 4 positioned above and below via the build-up layer 22. The via-hole conductor 5 is obtained by depositing, for example, copper plating, in a via hole penetrating the upper and lower surfaces of the build-up layer 22. A via-hole penetrating the upper and lower surfaces of the build-up layer 22 is formed by, for example, laser processing such as one using $CO_2$ laser, UV-YAG laser, excimer laser, or the like. The via-hole conductor 5 may be positioned filling the via hole, or the via-hole conductor 5 may be adhered to the inside surface of the via hole and a portion of the via hole where the via-hole conductor 5 is not provided may be filled with a resin.

Figure 2A:
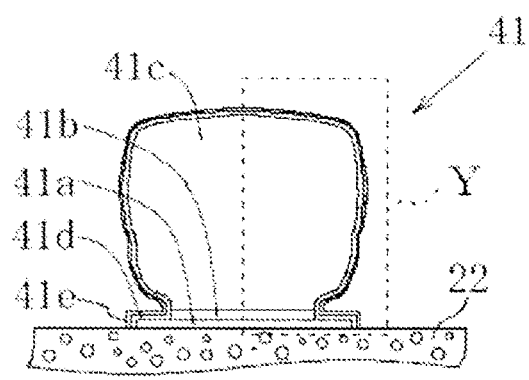
FIG. 2A is an enlarged explanatory view for explaining a region X in FIG. 1

Part of the electrical conductor layer 4 functions as a wiring conductor 41. As illustrated in FIG. 2A, the wiring conductor 41 includes a first underlying metal layer 41a, a second underlying metal layer 41b positioned on the first underlying metal layer 41a, a wiring metal layer 41c positioned on the second underlying metal layer 41b, a tin layer 41d positioned covering the first underlying metal layer 41a, the second underlying metal layer 41b, and the wiring metal layer 41c, and a silane coupling agent layer 41e positioned covering the tin layer 41d. FIG. 2A is an enlarged explanatory view for explaining the region X in FIG. 1.

The first underlying metal layer 41a serves as abase of the wiring conductor 41, and is in contact with the insulation resin layer 2. The first underlying metal layer 41a is not limited as long as it is made of, for example, a metal. Examples of the metal forming the first underlying metal layer 41a include at least one kind of metal selected from the group consisting of Group 4 elements, Group 5 elements, Group 6 elements, and Group 10 elements. Specific examples of such a metal include nickel, chromium, titanium, tantalum, molybdenum, tungsten, palladium, and an alloy containing any of these metals. Examples of the alloy include Nichrome. The first underlying metal layer 41a has a thickness of, for example, from 1 nm to 100 nm.

The second underlying metal layer 41b is positioned on the first underlying metal layer 41a. When the second underlying metal layer 41b is present, adhesiveness of the wiring metal layer 41c described later is further improved. Specifically, peel-off of the wiring metal layer 41c is more difficult to occur when the second underlying metal layer 41b is interposed between the first underlying metal layer 41a and the wiring metal layer 41c, as compared with a case in which the wiring metal layer 41c is in direct contact with the first underlying metal layer 41a. The second underlying metal layer 41b contains the same metal as that contained in the wiring metal layer 41c. For example, when the wiring metal layer 41c is made of copper, the second underlying metal layer is made of copper or a copper alloy. The second underlying metal layer 41b has a thickness of, for example, from 100 nm to 1000 nm.

The wiring metal layer 41c is a layer serving as a main body of the wiring conductor 41 and is positioned on the second underlying metal layer 41b. That is, charges flow mainly through the wiring metal layer 41c in the wiring conductor 41. The wiring metal layer 41c is made of copper and has a thickness of 1 µm or greater and 60 µm or less, for example. The second underlying metal layer 41b has a width narrower than that of the first underlying metal layer 41a.

Figure 2B:
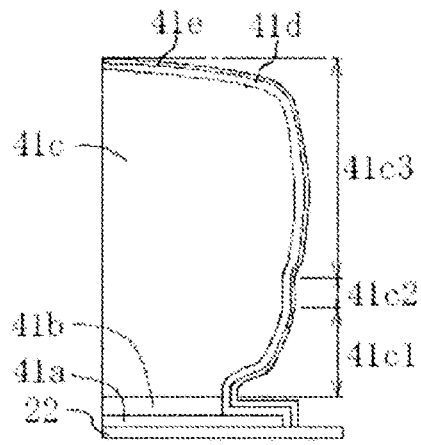
FIG. 2B is an enlarged explanatory view for explaining a region Y in FIG. 2A.

As illustrated in FIG. 2B, when the wiring conductor 41 is seen in a cross section in a width direction, the wiring metal layer 41c includes, from the first underlying metal layer 41a side, a portion 41c1 with a width narrower than the width of the first underlying metal layer 41a, a portion 41c2 with a width equal to the width of the first underlying metal layer 41a, and a portion 41c3 with a width wider than the width of the first underlying metal layer 41a. For example, when a plurality of wiring conductors 41 are arranged as illustrated in FIG. 1, the width direction of the wiring conductor 41 refers to the arrangement direction. The width of the portion 41c1 narrower than the width of the first underlying metal layer 41a is smaller than the width of the first underlying metal layer 41a by about more than the 300 nm and equal to or less than 1000 nm. The portion 41c2 with a width equal to the width of the first underlying metal layer 41a is not necessarily required to have completely the same width as that of the first underlying metal layer 41a and may have a width that falls within a range of the width of the first underlying metal layer 41a ±300 µm. The portion 41c3 with a width wider than the width of the first underlying metal layer 41a is wider than the width of the first underlying metal layer 41a by about more than the 300 nm and equal to or less than the 1200 nm. FIG. 2B is an enlarged explanatory view for explaining the region Y illustrated in FIG. 2A.

In the wiring board 1 according to the embodiment, the wiring metal layer 41c has such a configuration, so that it is possible to narrow a wiring width in the vicinity of a boundary between the wiring metal layer 41c and the insulation resin layer 2 where migration is likely to occur. That is, in the vicinity of the boundary between the wiring metal layer 41c and the insulation resin layer 2 where charges flow in a concentrated manner, an interval between the adjacent wiring metal layers 41c can be increased. As a result, migration can be reduced.

As described above, by reducing the wiring width in the vicinity of the boundary between the wiring metal layer 41c and the insulation resin layer 2 in the wiring conductor 41, the migration can be reduced and the insulating property is improved. However, a cross-sectional area of the wiring conductor 41 is reduced and the resistance is increased, so that the flow of charges is reduced. For this reason, in the present disclosure, the portion 41c3 with a width wider than the width of the first underlying metal layer 41a is provided at a portion higher than a certain height from a bottom surface of the wiring conductor 41 in a height direction of the wiring conductor 41. This reduces a resistance value of the wiring conductor 41 to improve the flow of charges. The wiring metal layer 41c includes the portion 41c2 with a width equal to the width of the first underlying metal layer 41a between the portion 41c1 with a width narrower than the width of the first underlying metal layer 41a and the portion 41c3 with a width wider than the width of the first underlying metal layer 41a, so that variation in width of the wiring metal layer 41c becomes gentle. For this reason, for example, when the wiring conductor 41 is covered with the insulation resin layer 2, it is possible to reduce entrapment of air such as voids.

Furthermore, when the wiring conductor 41 is covered with the insulation resin layer 2, the rougher the surface of the wiring conductor 41 is, the more the adhesion between the wiring conductor 41 and the insulation resin layer 2 is improved, but signal transmission characteristics are deteriorated due to a skin effect. In particular, such characteristics are remarkable in high-frequency signals. On the other hand, the smoother the surface of the wiring conductor 41 is, the more the signal transmission characteristics are improved, but the more the adhesion with the insulation resin layer 2 is reduced. Therefore, in the wiring board 1 according to the embodiment, in order to achieve both the signal transmission characteristics and the adhesion, the wiring metal layer 41c is provided with three regions of the portion 41c1 with a width narrower than the width of the first underlying metal layer 41a, the portion 41c2 with a width substantially equal to the width of the first underlying metal layer 41*a*, and the portion 41*c*3 with a width wider than the width of the first underlying metal layer 41*a*. With such a configuration, part of the insulation resin layer 2 covering the wiring conductor 41 enters the portion 41*c*1 with a width narrower than the width of the first underlying metal layer 41*a*, so that the insulation resin layer 2 securely holds the wiring conductor 41 to improve adhesion therebetween. An average roughness Ra of the surface of the wiring conductor 41 is, for example, 20 nm or greater and 1000 nm or less.

A ratio of the portion 41*c*1 with a width narrower than the width of the first underlying metal layer 41*a*, the portion 41*c*2 with a width equal to the width of the first underlying metal layer 41*a*, and the portion 41*c*3 with a width wider than the width of the first underlying metal layer 41*a* is not particularly limited. In consideration of compatibility between the effect of reducing migration and the flow of charges and signal transmission characteristics, the portion 41*c*3 with a width wider than the width of the underlying metal layer 41*a* preferably occupies a portion higher than 30% of a height of the wiring conductor 41 from the bottom surface thereof in the height direction of the wiring conductor 41.

The tin layer 41*d* is positioned covering the first underlying metal layer 41*a*, the second underlying metal layer 41*b*, and the wiring metal layer 41*c*. The tin layer 41*d* has a function of causing the silane coupling agent layer 41*e*, which will be described later, to stably adhere to the surface of the wiring conductor 41. The tin layer 41*d* has a thickness of, for example, from 0.1 nm to 10 nm.

The silane coupling agent layer 41*e* is positioned covering the tin layer 41*d*. In general, the adhesiveness between a metal and a resin is poor. The silane coupling agent is a compound containing, in the molecule, a functional group that reacts with an inorganic material and a functional group that reacts with an organic material. For this reason, the presence of the silane coupling agent layer 41*e* can improve the adhesiveness (adhesion) between the wiring conductor 41 and the insulation resin layer 2 around the wiring conductor 41. The presence of such a silane coupling agent can be confirmed, for example, by analyzing the functional group structures using Fourier transform infrared spectroscopy (FTIR).

Solder resists 6 are positioned on part of both surfaces of the wiring board 1 according to the embodiment. The solder resist 6 is made of, for example, an acrylic-modified epoxy resin. The solder resist 6 has a function of protecting the electrical conductor layer 4 and the like from solder when, for example, an electronic component is mounted or connected to a motherboard or the like.

A method of forming the wiring board 1 according to the embodiment is not limited, and the wiring board 1 is formed by, for example, the following method.

First, a double-sided copper-clad laminate plate to be the core layer 21 is prepared, and a through-hole is formed therein. The through-hole is formed by, for example, drill processing, laser processing, blast processing, or the like.

Next, electroless plating and electrolytic plating are performed on a surface of the copper foil of the laminate plate and in the through-hole to deposit a plating metal. The plating metal may be copper, for example.

Next, an etching resist is formed on a surface of the plating metal corresponding to a wiring pattern, the plating metal on which the etching resist is not formed is removed by etching, and then the etching resist is removed. Consequently, the electrical conductor layer 4 is formed on the surface of the core layer 21, and the through-hole conductor 3 is formed in the through-hole.

Next, insulation films for build-up layers are adhered on both surfaces of the core layer 21 and cured to form the insulation resin layers 2.

Next, the first underlying metal layer 41*a* is formed on the surface of the insulation resin layer 2, i.e., the surface of the build-up layer 22 by a vapor deposition method such as a sputtering method, an ion-plating method, or a thermal vapor deposition method. As described above, the first underlying metal layer 41*a* is made of at least one kind of metal selected from the group consisting of Group 4 elements, Group 5 elements, Group 6 elements, and Group 10 elements.

Next, the second underlying metal layer 41*b* is formed on the main surface of the first underlying metal layer 41*a* by a vapor deposition method such as a sputtering method, an ion-plating method, or a thermal vapor deposition method. The second underlying metal layer 41*b* is made of, for example, copper, as described above.

Next, a photosensitive plating resist (for example, a dry film resist) is formed on the surface of the second underlying metal layer 41*b*, and an opening where metal plating (for example, copper) is to be deposited (a portion where the wiring metal layer 41*c* is to be formed) is formed by exposure and development. At the time of exposure, an amount of light is adjusted such that an opening diameter on the second underlying metal layer 41*b* side becomes narrow.

Next, a plating metal such as copper is deposited in the opening of the plating resist by electroless plating and electrolytic plating. The deposited copper finally becomes the wiring metal layer 41*c*. After the deposition, the plating resist is removed with an alkaline solution such as a sodium hydroxide solution.

After removing the resist, a portion of the second underlying metal layer 41*b* that is not covered with the deposited copper is removed with, for example, acid (a mixed solution of sulfuric acid and hydrogen peroxide water). Furthermore, the first underlying metal layer 41*a* is removed by etching (seed etching) with, for example, acid (such as a mixed solution of hydrochloric acid and sulfuric acid).

Next, the surfaces of the deposited copper, the second underlying metal layer 41*b*, and the first underlying metal layer 41*a* are treated by soft etching. The soft etching is performed using, for example, acid (a mixed solution of sulfuric acid and hydrogen peroxide water). Although the surfaces of the deposited copper and the second underlying metal layer 41*b* are slightly eroded by the soft etching, the first underlying metal layer 41*a* is hardly removed. For this reason, the portion 41*c*1 with a width narrower than the width of the first underlying metal layer 41*a* is formed in the wiring conductor 41.

Next, displacement tin plating is performed to cover the surfaces of the first underlying metal layer 41*a*, the second underlying metal layer 41*b*, and the wiring metal layer 41*c*. By the displacement tin plating, the surfaces of the first underlying metal layer 41*a*, the second underlying metal layer 41*b*, and the wiring metal layer 41*c* are substituted with tin to form the tin layer 41*d*. Next, the silane coupling agent is caused to adhere to a surface of the tin layer 41*d*. In this way, the silane coupling agent layer 41*e* is formed covering the surface of the tin layer 41*d*.

In the manner described above, the wiring board 1 according to the embodiment is obtained. The wiring board of the present disclosure is not limited to the embodiment described above. In the wiring board 1 according to the embodiment, the second underlying metal layer 41*b* is formed between the first underlying metal layer 41*a* and the wiring metal layer 41*c* in the wiring conductor 41. However, in the wiring board of the present disclosure, when the wiring metal layer 41c sufficiently adheres to the first underlying metal layer 41a, the second underlying metal layer 41b need not be formed.

REFERENCE SIGNS

1 Wiring board
2 Insulation resin layer
21 Core layer
22 Build-up layer
3 Through-hole conductor
4 Electrical conductor layer
41 Wiring conductor
41a First underlying metal layer
41b Second underlying metal layer
41c Wiring metal layer
41d Tin layer
41e Silane coupling agent layer
5 Via-hole conductor
6 Solder resist

The invention claimed is:

1. A wiring board comprising:
an insulation resin layer; and
a wiring conductor positioned on the insulation resin layer,
wherein the wiring conductor comprises:
a first underlying metal layer,
a second underlying metal layer positioned on the first underlying metal layer,
a wiring metal layer positioned on the second underlying metal layer,
a tin layer positioned covering the first underlying metal layer, the second underlying metal layer, and the wiring metal layer, and
a silane coupling agent layer positioned covering the tin layer, and
when the wiring conductor is seen in a cross section in a width direction, the wiring metal layer comprises, from the first underlying metal layer side, a portion with a width narrower than a width of the first underlying metal layer, a portion with a width equal to the width of the first underlying metal layer, and a portion with a width wider than the width of the first underlying metal layer.

2. The wiring board according to claim 1, wherein the portion with a width wider than the width of the first underlying metal layer is positioned at a portion higher than 30% of a height of the wiring conductor from a bottom surface of the wiring conductor in a height direction of the wiring conductor.

3. The wiring board according to claim 1, wherein the first underlying metal layer contains at least one kind of metal selected from the group consisting of Group 4 elements, Group 5 elements, Group 6 elements, and Group 10 elements.

4. The wiring board according to claim 3, wherein the first underlying metal layer is made of nickel, chromium, titanium, tantalum, molybdenum, tungsten, palladium, or an alloy containing any of these metals.

5. The wiring board according to claim 1, wherein the second underlying metal layer is made of copper or an alloy containing copper.

6. The wiring board according to claim 1, wherein a width of the lowest portion of the wiring metal layer and a width of the second underlying metal layer are equal.

* * * * *